April 2, 1963 J. MUNUSHIAN ETAL 3,084,293

MICROWAVE AMPLIFIER

Filed April 1, 1959 4 Sheets-Sheet 1

INVENTORS.
JACK MUNUSHIAN,
JACK KLIGER,

BY R. A. Bogucki

ATTORNEY

INVENTORS.
JACK MUNUSHIAN,
JACK KLIGER,
BY R. A. Bogucki
ATTORNEY

April 2, 1963 J. MUNUSHIAN ET AL 3,084,293

MICROWAVE AMPLIFIER

Filed April 1, 1959 4 Sheets-Sheet 3

INVENTORS.
JACK MUNUSHIAN,
JACK KLIGER,

BY R. A. Boguchi

ATTORNEY

MICROWAVE AMPLIFIER

Filed April 1, 1959

INVENTORS.
JACK MUNUSHIAN,
JACK KLIGER,
BY R. A. Bogucki
ATTORNEY.

3,084,293
MICROWAVE AMPLIFIER
Jack Munushian, Pasadena, and Jack Kliger, Los Angeles, Calif., assignors to Hughes Aircraft Company, Culver City, Calif., a corporation of Delaware
Filed Apr. 1, 1959, Ser. No. 803,425
3 Claims. (Cl. 330—43)

This invention relates to electronic amplifiers, and particularly to microwave amplifiers having large dynamic ranges, especially those which are capable of synthesizing desired signal characteristics, such as logarithmic or limiting responses.

The general problem of increasing the versatility of amplification equipment in electronic systems is well known. For example, it is recognized that if the dynamic range of a receiver can be increased by suitable amplification devices, it is possible to detect small signals more reliably against a noise background. An increase in dynamic range also decreases the tendency of a receiver to saturate when large signals are being received. This is especially important if it is desired to receive small signals against a background of large interfering signals. Thus, an increase in the dynamic range of an amplifier can provide immediate improvements in the systems in which it is used.

At the same time, however, it is also desirable to be able to synthesize certain responses. If the increase in dynamic range is accompanied by a precise calibration of the signals in accordance with a known characteristic, a number of operative advantages may be derived and system requirements may be considerably simplified. Thus, if the amplifier can have a logarithmic response, the increase in dynamic range is accompanied by the ability directly to provide a visual representation or recorded output on a logarithmic scale. Similarly, a limiting response at a selected level is extremely useful in many systems.

While logarithmic amplifiers and limiters, for example, are well known at the lower frequencies, it is desirable in many instances to provide increased dynamic range in the microwave region of the spectrum. Many uses can be described for devices which convert, with some amplification and a synthesized response characteristic, from RF to RF, from RF to IF, or from RF to video. Microwave preamplifiers can appreciably increase the sensitivity of a receiver. Many instrumentation applications can effectively make use of amplifiers which convert from a microwave signal to a video signal with a logarithmic characteristic. High resolution radar systems could be appreciably improved through the use of amplifiers operating from RF to IF with concurrent increase in the dynamic range.

It would be highly advantageous when operating in the microwave region to be able to use traveling-wave devices such as the traveling-wave tube and traveling-wave versions of the maser and the parametric amplifiers. These devices are well known as high gain amplifiers having wide bandwidths, and are capable of extremely low noise operation. Particular ones of the enumerated devices are often especially suited for specific applications, where gain, frequency, bandwidth or noise may be controlling factors. Consequently, if such devices can be employed so as to have additional capabilities, such as an increased dynamic range, then important advantages can be realized. Receivers can be considerably simplified through the combination of preamplification and signal compression functions. Such combinations of features are even more desirable, of course, if they can be achieved with a lightweight, compact structure which does not impose additional requirements on the system.

Therefore, an object of the present invention is to provide improved microwave amplifiers.

A further object of this invention is to provide systems for appreciably increasing the dynamic range of existing microwave amplifiers.

Another object of this invention is to provide improved microwave amplifiers having signal compression capabilities.

A further object of this invention is to provide improved logarithmic amplifiers which operate in the microwave region and provide a marked increase in dynamic range over a wide bandwidth.

Yet another object of this invention is to provide traveling-wave devices which are capable of synthesizing selected response characteristics giving increased dynamic range.

Still another object of this invention is to provide amplifying devices which operate from a microwave RF signal to provide an output of desired characteristics.

Yet another object of this invention is to provide a high gain and wide bandwidth microwave amplifier capable of providing logarithmic amplification or limiting action.

A further object of this invention is to provide microwave amplifiers of improved dynamic range which can provide RF to RF, RF to IF or RF to video operation.

These and other objects of the present invention are achieved by an arrangement utilizing a successive-signal-removal technique with traveling-wave devices. In one form of the invention, an adding helix may be positioned adjacent to the helix of a traveling-wave tube. This form of the device constitutes RF to RF operation of the amplifier while simultaneously providing a desired total response such as, for example, extended dynamic range of a logarithmic or of a flat limiting nature. The adding helix is of like configuration and characteristics to the helix of the traveling-wave tube. A number of microwave couplers are used along the length of the two helices, each coupling arrangement providing an exchange of energy from a region of the principal helix to an associated region of the adder helix. The arrangement is such that the continually increasing energy in the traveling wave of the traveling-wave tube is successively coupled out and onto the adder helix, so as to generate a corresponding traveling wave.

A uniform attenuating coating on the traveling-wave tube may be used to establish uniformity between the sections and to reduce backward waves.

The saturation characteristics of the successive tube sections may be so designed as to synthesize the desired total response. Although the output of each coupling unit saturates at a different level of input signal, the signal contribution from the unit does not thereafter remain constant but decreases. The relationship between the various coupling sections is, however, arranged to achieve the desired output characteristic. In addition, the arrangement between the input to the traveling-wave tube and the first coupling unit can be such that a direct coupling is established to augment the system response at very high input signal levels.

In another form of the RF to RF version of the invention, the successively removed signals are combined in proper relation through the use of coaxial line phase shifting, attenuating and coupling elements which are combined to form an adding arrangement, and which can be adjusted to synthesize the desired response.

According to other features of this invention, the successive-signal-removal principle may be utilized with other signal recombination and addition arrangements. In one form, there may be a successively tapped delay line, with the outputs of each of the coupling points from the traveling-wave tube being rectified and then applied to a different point of the delay line. In this arrangement, the values of the elements within the delay line and the placement of the couplers may be adjusted to again provide the desired amplification characteristics. The rectifying elements are inserted in the coupling lines between the traveling-wave tube and the points of the delay line so as to provide a video output from the microwave signal. This form of device constitutes RF to video operation.

In still another form of the invention, the rectifying elements may be replaced by mixing elements which are each fed from a common local oscillator signal source. By properly adjusting the frequency of the local oscillator, the microwave signal on the traveling-wave tube may be converted to a desired intermediate frequency signal on the delay line. This frequency conversion is again accompanied by an increase in the operating dynamic range of the traveling-wave tube and constitutes RF to IF operation.

Although the arrangements are illustrated as utilizing traveling-wave tubes, they may be constructed with equal facility with other traveling-wave devices. Thus they may also be employed with traveling-wave masers or parametric amplifiers.

The novel features of this invention, as well as the invention itself, may be better understood by reference to the following description, taken in connection with the accompanying drawings, in which like reference numerals refer to like parts and in which.

Figures 1, 2, 3:
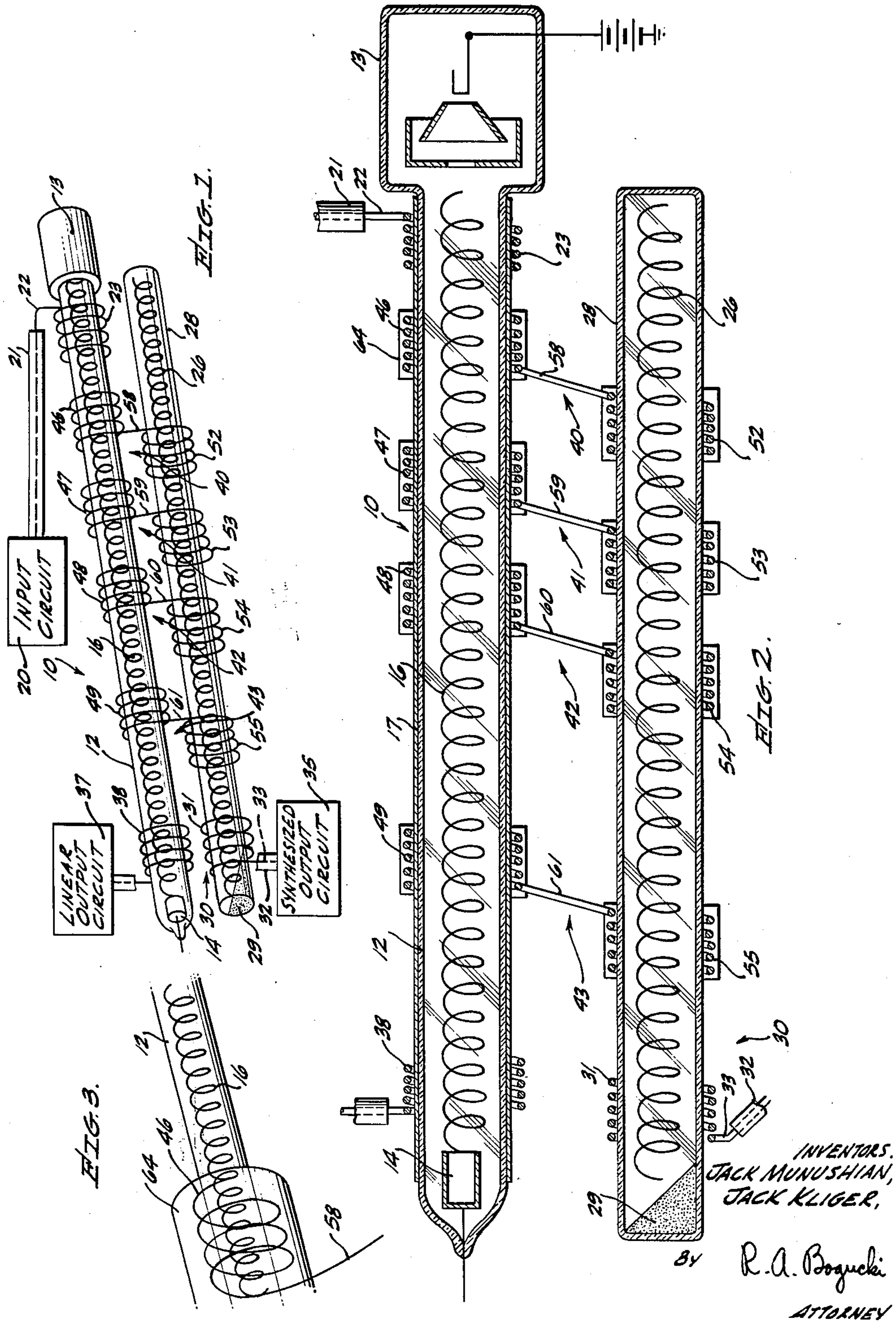
FIG. 1 is a simplified perspective view of an RF to RF version of one form of microwave amplifier using a successive-signal-removal technique in accordance with the present invention.
FIG. 2 is an enlarged side sectional view of the arrangement of FIG. 1.
FIG. 3 is an enlarged fragmentary view of a portion of the structure of FIGS. 1 and 2.

An arrangement for providing an amplifier of very great dynamic range in the microwave region which utilizes the successive-signal-removal principle to form an RF to RF amplifier system is illustrated in FIGS. 1, 2 and 3, to which reference is now made. The arrangement includes a traveling-wave tube 10, including an evacuated envelope structure 12 (best seen in FIG. 2) having the usual form of electron gun 13 and electron collector 14. A slow-wave structure 16 extends along the central length of the traveling-wave tube 10 between the electron gun 13 and the collector ends 14. The slow-wave structure is here shown in the form of a helix 16, hereafter referred to as the principal helix 16. Details of the traveling-wave tube 10, including details of the gun structure 13 and focusing means (not shown), and details of the manner in which the principal helix 16 is supported, have been omitted for simplicity in the drawing. Thus, it will be understood that focusing magnets or electromagnets (not shown) are employed in the usual fashion. Along the length of the traveling-wave tube 10, on the outer surface of the evacuated envelope 12, is disposed a relatively uniform resistive coating 17, such as aquadag or like material, which can perform the function of absorbing microwave energy.

The traveling-wave tube 10 is operated in a conventional fashion. A stream of electrons is directed along the central axis of the tube 10 between the negatively charged cathode in the electron gun 13 and the collector 14 at the other end. The electrons travel in energy interchange relationship with a traveling wave propagated along the helix 16, with the axial phase velocities of the electron stream and the traveling wave being selected to result in amplification of the traveling wave due to the exchange of energy between the stream and the traveling wave.

With this arrangement, input energy is provided from an input circuit 20 (FIG. 1) to an input coupler 23 through a coaxial line 21, the center conductor 22 of the coaxial line 21 being wound helically about the envelope 12 of the traveling-wave tube 10 at a point adjacent to the electron gun 13 end of the tube 10. The input coupler 23, therefore, provides a microwave transmission line which is electromagnetically coupled to the electron gun, or input, end of the principal helix 16. Energy provided from the input circuit is, therefore, launched onto the principal helix 16 from the input coupler 23.

With this arrangement is also employed a separate adder helix 26 spaced apart from and substantially parallel to the principal helix 16. The adder helix 26 is positioned within an elongated envelope 28 and has input and output ends corresponding to the like ends of the traveling-wave tube 10. A termination 29 is formed by attenuative material positioned in the output end of the envelope 28 containing the adder helix 26. The adder helix 26 is selected to have substantially the same configuration and properties as the principal helix 16. Specifically, the size and pitch of the adder helix 26 are made approximately the same as those of the principal helix 16, so that the phase velocity versus frequency characteristic of the adder helix 26 is equal to that of the principal helix 16 in the presence of its attenuative film and the electron beam. Again, the means for supporting the adder helix 26 within the surrounding envelope 28 have not been shown. A microwave output coupler 30 consisting of a helical microwave transmission line 31 terminating in the center conductor 33 of a coaxial line 32 coupled to an output circuit 35 (FIG. 1) is positioned at the output end of the adder helix 26 for coupling off energy propagated thereon. The output circuit 35 is referred to as providing a "synthesized" output, in accordance with the manner in which desired responses may be provided. The tube 10 may also have a linear output circuit 37, coupled at the collector end 14 by another output coupler 38.

With this arrangement there is also employed a group of microwave energy couplers 40, 41, 42, 43 selectively positioned at spaced regions along the lengths of the principal helix 16 and the adder helix 26. Four of these couplers 40 to 43 are shown and each consists of one helical coupler 46 to 49 respectively wound about the exterior of the envelope 12 which surrounds the principal helix 16, one helical coupler 52 to 55 respectively wound about the envelope 28 containing the adder helix 26, and an interconnecting length of transmission line 58 to 61 respectively. Each of the couplers 46 to 49 or 52 to 55 is in energy interchange relationship with the associated helix 16 or 26, as may be seen in more detail in the fragmentary view of FIG. 3. Any number of couplers can be used consistent with space limitations, but it has been found that three or more are desirable for the synthesis of a smooth response characteristic. The various couplers 46 to 49 or 52 to 55 may be embedded in hollow cylinders 64 of a plastic or other material which is substantially transparent to microwave energy. When so constructed, the couplers 40 to 43 may be constructed individually and slid onto the associated envelopes 12 and 28 to the positions desired and with proper support and spacing.

The arrangement constructed as shown in FIGS. 1, 2 and 3 provides amplification of applied input signals with a response characteristic which can have a large dynamic range, and which specifically can be a logarithmic characteristic or a limiting characteristic if such is desired. The input circuit 20 provides the RF energy which it is desired to amplify, and this energy is launched onto the principal helix 16 from the input coupler 23. As the traveling wave moves along the principal helix 16 from the input to the output ends, it is amplified due to the interaction between the electron stream and the traveling wave. The successive extraction or removal of signals is accomplished by the separate energy couplers 40 to 43 disposed along the length of the principal helix 16. As the energy reaches the coupling helix 46 closest to the input end, for example, at least a portion of the energy is coupled off to the coupler 40, and transferred to the associated coupling helix 52 about the adder helix 26, from whence it is launched onto the adder helix 26. The proportion of the traveling wave which is removed from the principal helix 16 and coupled onto the adder helix 26 is determined in accordance with considerations given in more detail below. The couplers 40 to 43 are arranged, as to the number of turns employed and their proximity to the associated helices 16 and 26, to provide a selected coupling proportion, which may be unity but is usually somewhat less than unity.

Because of the like characteristics of the traveling waves in the principal helix 16 and the adder helix 26, these traveling waves have a like axial phase velocity. Energy which is coupled off the principal helix 16 therefore establishes a like traveling wave in the adder helix 26. After the energy is extracted or removed, the traveling wave on the principal helix 16 is again amplified by the time the second coupler 41 is reached. Again, therefore, energy is extracted and transferred to the adder helix 26 in the same manner as was accomplished at the first coupler 40. Because the axial phase velocities in the two helices 16, 26 are alike, and with the couplers 40 to 43 having like relative axial dispositions along the two helices 16 and 26, the energy extracted at the second coupler 41 from the principal helix 16 is added to the traveling wave along the adder helix 26 in phase with the energy launched onto the adder helix 26 from the first coupler 40. Consequently, like time portions of the input wave are recombined additively, so that the traveling wave in the adder helix 26 is built up in a nonlinear fashion. The action of the third and fourth couplers 41, 42 in contributing in-phase components to the traveling wave in the adder helix 26 which correspond to like input portions of the signal being amplified in the principal helix 16 is the same as that previously described.

The net result, as seen at the output of the adder helix 26, is that a traveling wave is built up which has much smaller amplitude variations than the variations of the input signal, and which result corresponds to the desired increase in dynamic range. Substantially all of this nonlinearly amplified energy is extracted by the output coupler 30 and such as remains is dissipated in the resistive termination 29, in order to avoid reflective effects. The synthesized output circuit 35 thus receives the signals of the desired response characteristic. The linear output circuit 37 concurrently receives the regular output of the tube 10.

Thus this arrangement operates as an RF to RF amplifier, of increased dynamic range, and makes possible the combination of a number of functions in many circuits. The traveling-wave helices employed are nondispersive, and thus the phase velocities of the signals along the helices are independent of frequency in the frequency range of operation. Thus the manner in which the signals are recombined on the adder helix 26 is essentially independent of frequency and the device is substantially as broadband as the traveling-wave-tube 10 itself.

A number of details in the construction of this arrangement are to be noted, these details serving individually and in combination to provide desirable features and to enable the more ready synthesis of characteristic responses. The attenuating coating 17 upon the envelope 12 of the traveling-wave tube 10 assists in establishing uniformity of the sections between the various couplers 40 to 43. Further, this attenuation material 17 reduces the reflective effects which result in backward waves being propagated along the helix 16, which waves would increase the tendency to oscillate and which would also reduce the gain of the system. The coupling ratio of the various coupling sections 40 to 43 is adjusted to be less than unity, in order to insure that energy is coupled from the principal helix 16 and onto the adder helix 26 with a mininum of coupling in a reverse direction. With full unity coupling at the later helical coupling sections 53 to 55 on the adder helix 26, a portion of the recombined traveling wave might tend to enter these helical couplers 53 to 55. Such energy would either be dissipated at the termination of the coupler 53 to 55 or reflected back to the principal helix 16. To keep these losses within limits which do not affect the synthesis of the desired response the coupling ratio of the couplers 40 to 43 is here made less than unity.

Further, the amount of the coupling of the individual couplers 46 to 49 on the principal helix 16 is decreased between successive couplers 46 to 49 in the direction from the input end toward the output end. This arrangement results in a monotonically increasing output signal although further modifications may also be made when it is desired to synthesize certain other responses. The reason for less coupling toward the output end is derived generally from the fact that with low level input signals saturation occurs only toward the output end. The maximum outputs of each of the couplers 46 to 49 are approximately the same. Therefore, if the last coupler 49 along the path of the traveling wave has a high amount of coupling, this constitutes a limitation upon the total output signal, which cannot be made to increase above the normal saturation point. Consequently, coupling is reduced toward the output end, so that as the input signal increases and the traveling-wave tube 10 saturates nearer the input end, the various couplers 40 to 43 still additively combine to provide an increased total signal. This increase in dynamic range is at the expense of small signal gain, but the gain can still be kept substantially high. Additionally, the availability of the linear output makes possible great flexibility.

The features of operation of this arrangement include two considerations which make possible the desired response characteristic. First, in the operation of the combination it has been found that when saturation is reached in one of the coupling units 40 to 43, the response does not thereafter remain constant for that coupler but, instead, decreases. Arrangements which rely on a constant maximum output from the individual stages to achieve signal addition are therefore not applicable. Instead, in the present arrangement, the coupling of the first couplers (with respect to the traveling wave) is made to compensate for decreases in the output of succeeding couplers, as the input signal increases. Consequently, for a preferred response there is a selected relationship between the sequentially disposed couplers 40 to 43 which is arranged to compensate for the operation of the other couplers.

Figure 4:
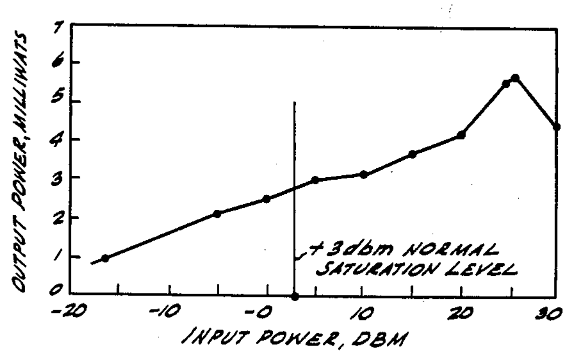
FIG. 4 is a graph showing operating characteristics which can be provided with the arrangement of FIGS. 1 to 3.

A typical response for such an arrangement is shown in FIG. 4, which represents the variation in output power in milliwatts for variations in input signal. Only three couplers were employed. The output power in milliwatts is seen to be a substantially linear function of the input power in decibels relative to a milliwatt (dbm). The response is therefore essentially logarithmic. It can also be seen that the normal saturation level of the tube has been extended considerably by the modifications made in the external circuitry of the tube.

Another significant feature is derived from the position of the first of the couplers 40 relative to the input coupler 23. As the input signal increases to a large magnitude, a point is reached at which the traveling-wave tube 10 is near saturation at its input end, a fact which would normally limit the output from the amplifier system. By positioning the first coupler 40 close to the input coupler 23, however, this arrangement provides that there is a direct coupling of energy between these elements at high input signal levels. Consequently, with a further increase in the input signal, the output continues to increase despite saturation of the traveling-wave tube 10. There is no fundamental limitation on the input power level of operation of the traveling-wave tube 10, therefore, except for structural failures.

It will be appreciated by those skilled in the art that the use of a signal removal technique with a traveling wave for the purpose of synthesis of a desired response is not confined to the example shown. The traveling wave may be considered to constitute a spatial distribution of the input signal because any given portion of the input signal shifts in space as the traveling wave grows. Consequently, the signal extraction and recombination technique may effectively be employed wherever electromagnetic coupling can be made to a traveling wave. Thus the slow wave structures and the couplers need not be helices, for example, but they can instead be of other forms, such as folded waveguides and energy excited probes. The traveling wave device, similarly, need not be a traveling-wave tube but can be a traveling wave version of a maser or parametric amplifier.

Figure 5:
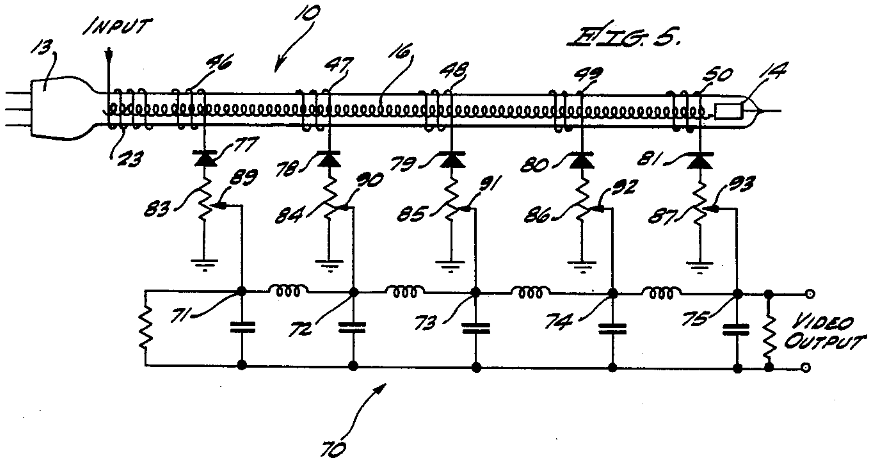
FIG. 5 is a representation partly in side elevation and partly in schematic form, of an RF to video arrangement of a traveling-wave amplifier in accordance with the successive-signal-removal technique of the present invention.

Another arrangement in accordance with the invention, referring now to FIG. 5, may utilize the successive detection principle in conjunction with a delay line to provide an RF conversion to a video output. As shown in FIG. 5, a traveling-wave tube 10 (indicated generally) may have an input coupler 23 coupled to a source of RF energy (not shown) which is to be converted to a video output with a specified amplification characteristic. The traveling-wave tube 10 includes a principal helix 16, an electron gun 13, and a collector 14. Positioned along the length of the traveling-wave tube 10 are five helical couplers 46–50 similar to those described above although any number of couplers may be used consistent with the lengths of the individual couplers and of the traveling-wave tube.

Each of the helical transmission line couplers 46–50 thus formed is coupled to a separate tap 71 to 75 respectively on a delay line 70 through a different individual detector, such as a crystal diode 77 to 81 respectively, and a variable resistive element 83 to 87 respectively having a movable tap 89 to 93 respectively. The delay line 70 is composed in the usual form of distributed capacitance and inductance elements. Successive points along the delay line 70 constitute the taps 71 to 75 respectively which are connected to the traveling-wave tube 10. In this arrangement, control of the coupling from the separate points along the traveling-wave tube 10 can be accomplished by adjustment of the variable resistors 83 to 87, as well as by control of the coupling ratios through selection of the number of turns and the proximity of the turns in the individual couplers 46 to 50 to the principal helix 16 of the traveling-wave tube 10.

The delay time of the delay line 70 is selected to correspond to the axial phase velocity of the traveling wave in the traveling-wave tube. The diodes 77 to 81 constitute detector elements for the microwave energy, the successively coupled-out signals being applied to the coupled taps 71 to 75 of the delay line 70. Therefore, the delay line 70 serves as an adding network for recombining in time coincidence the like time portions of the input signal applied from the traveling-wave tube 10. It may be considered that the energy from the couplers is recombined in cascaded series fashion to provide a summed output. The delay line constants may be adjusted further to compensate for delays or adjustments in the RF signal in the traveling-wave tube 10, it being well known that there is a slowing of the electron stream in a traveling-wave tube due to the loss of energy encountered in transit of the tube by the electron stream.

Figure 6:
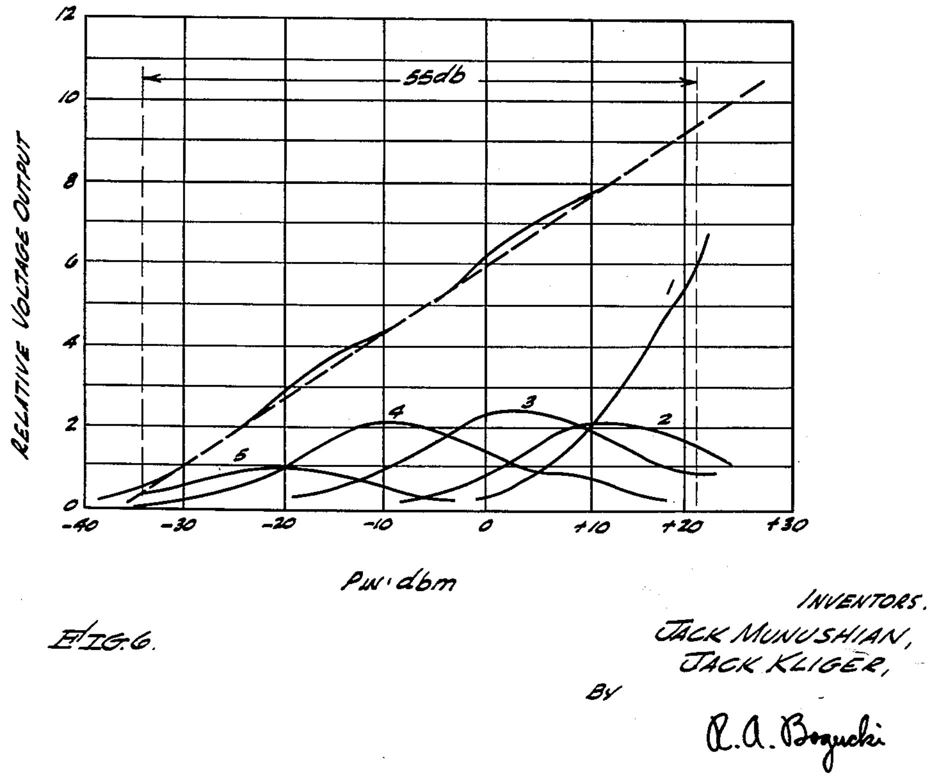
FIGS. 6 and 7 are graphs of the output signal as a function of the input signal for the arrangement of FIG. 5, when adjustment has been made for operation as logarithmic amplifier and a limiter, respectively.
Figure 7:
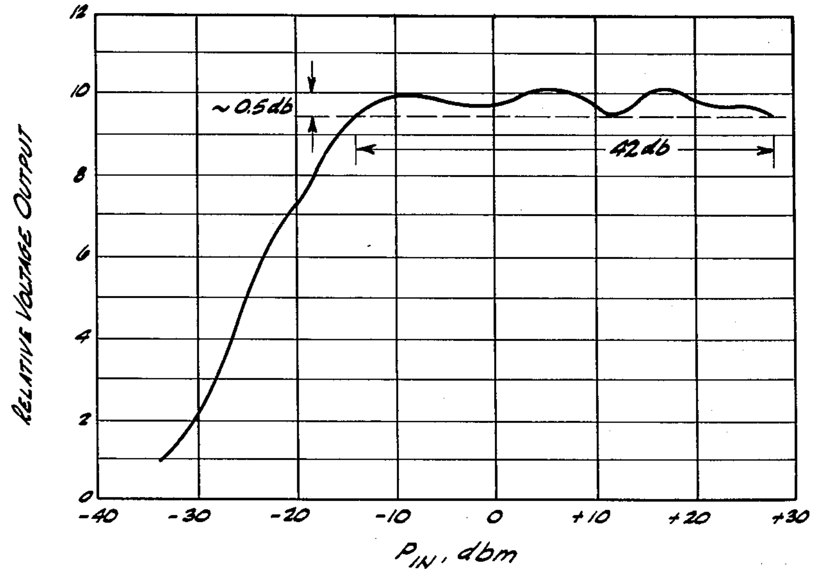

The detected signals applied to the delay line 70 are thus video signals which are additively combined. Both the proportion of the energy coupled and the amount of the resistance 83 to 87 employed determines the contribution of the individual couplers 46 to 50 to the delay line 70. Because these contributions are added together in the delay line 70, they determine the characteristic response of the system, and permit the synthesis of specific desired responses. The manner in which two separate responses may be synthesized is shown in FIGS. 6 and 7, respectively. The arrangement utilized employed a signal generator having a 3100 mc. input signal modulated at 1000 c.p.s. As shown in FIG. 6, the video output voltage from the delay line was measured and plotted against the input power, power being a more commonly used unit in traveling-wave tube work than is input voltage. Because the logarithm of the input power is a function of the logarithm of the input voltage, a straight line on FIG. 6 thus indicates a logarithmic response. The individual curves for each coupler in FIG. 6 show that the components from the separate detectors are additively combined to synthesize the desired logarithmic characteristic. The output contribution from each coupler 46 to 50 is shown as 1 to 5 respectively. Note that each except the first falls off after reaching a peak. The first provides a continually increasing contribution at high levels, because of the direct coupling to the input coupler 23.

This arrangement thus is also illustrative of the manner in which the saturation and characteristics of the various sections may be adjusted to provide the desired unified result. Except for the output of the first coupler 46, the outputs from the individual couplers 47 to 50 first increase with increasing input power, then reach maximum values and then begin to decrease. The position of each coupler 46 to 50 and its coupling efficiency determines the nature of the curve. The settings of the variable resistors 83 to 87 determine the relative contribution from each coupler. Thus the total response from selected points can be combined by proper control of these variables to give the desired logarithmic result.

The curve for the response of the first coupler in FIG. 6 also illustrates the freedom from limitations due to the saturation of the tube. Because of the direct coupling between the input coupler 23 and the first coupler 46, the output continues to increase. Variation of the position of the first coupler 46 with respect to the input coupler 23 can be utilized to provide control of this effect. In an arrangement constructed in accordance with this invention, the response curve of FIG. 6 is achieved by varying only the settings of the variable resistors 83 to 87. As seen in FIG. 6, this arrangement provides less than a 0.4 decible variation from a logarithmic response over a range of 55 decibels. Furthermore, the saturation level is over 40 decibels greater than that possible by using a conventional single-output coupler traveling-wave tube.

The same arrangement may also be utilized to provide a limiter type of response. As shown in FIG. 7, the settings of the variable resistors 83 to 87 can be adjusted to provide a selected maximum response, with a substantially flat characteristic, at the power level selected for limiting. As may be seen in FIG. 7, the limiting action is constant to within 0.5 decibel over a 42 decibel dynamic range.

Figure 8:
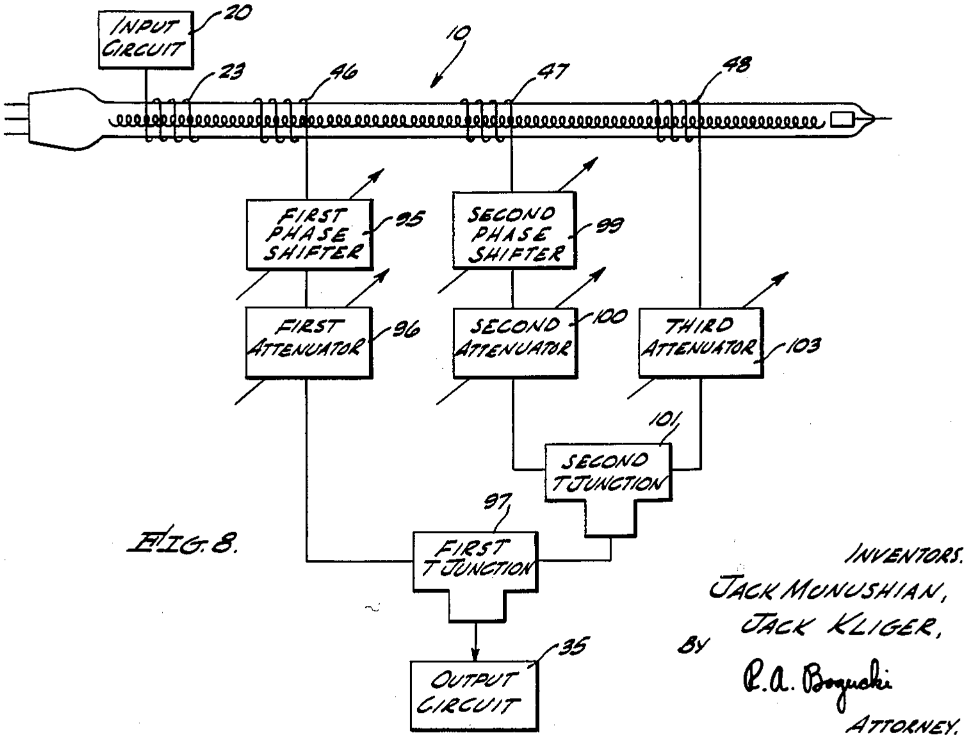
FIG. 8 is a representation, partly in schematic and partly in block diagram form, of another arrangement in accordance with the invention, utilizing microwave elements to provide another form of RF to RF operation.

Other techniques may also be utilized to provide the successive extraction and recombination of signals. Thus, as shown in FIG. 8, a microwave system may be utilized in which there is again RF to RF operation. A cascaded series of couplers and a signal delay device are again used in providing RF addition of signals in a fashion corresponding to the arrangement of FIG. 1. Control of the phase and relative amplitudes of the energy is achieved in this arrangement through the use of variable attenuators, variable phase shifters, and microwave junctions. For simplicity, only three couplers 46 to 48 have been shown at successive points along the length of a traveling-wave tube 10. The first of these couplers 46 (taken with respect to the traveling wave) provides energy through a first variable phase shifter 95 and a first variable attenuator 96 to one symmetrical input of a first microwave T junction 97. The second coupler 47 extracts energy from the traveling wave and couples it through a second variable phase shifter 99 and a second attenuator 100 to one symmetrical input of a second microwave T junction 101. The remaining input of the second T junction 101 is coupled to the third coupler 48 through a third variable attenuator 103. Outputs from the second T junction 101 are coupled to the remaining input arm of the first T junction 97, outputs from the first T junction 97 constituting outputs from the system and being directed to the output circuit 35.

The elements which may be employed in this arrangement have been indicated only generally, but may be coaxial forms of microwave transmission devices. It will be understood that the elements indicated as phase shifters are intended to represent generally those devices which provide a relative phase difference, whether through controlled or actual differences in electrical line lengths. Similarly, the attenuators may be any form of amplitude control or power splitting device, and the microwave junctions may be any form desired of energy combination device.

With this version of an RF to RF amplifier, selection of the amount of signal extracted from each of the coupling regions along the traveling-wave tube 10 is controlled both by the characteristics of the couplers 46 to 48 themselves and by the values at which the variable attenuators 96, 100, 103 are set. The variable phase shifters 95, 99 are adjusted to provide in-phase coupling of the microwaves from the first coupler 46, the second coupler 47 and the third coupler 48. Energy removed from the traveling wave in the tube 10 at the second coupler 47 is delayed sufficiently to be combined in phase at the second T junction 101 with energy extracted from the third coupler 48. Thus like signal portions are recombined in time coincidence. A similar delay of the energy from the first coupler 46 is effected, to provide a further in-phase relationship, so that combination of the output of the second T junction 101 and the output of the first attenuator 96 gives the final recombined signal output from the first T junction 97 to the output circuit 35. Thus this is another form of RF to RF operation which may be preferable in some instances.

Figures 9, 10:
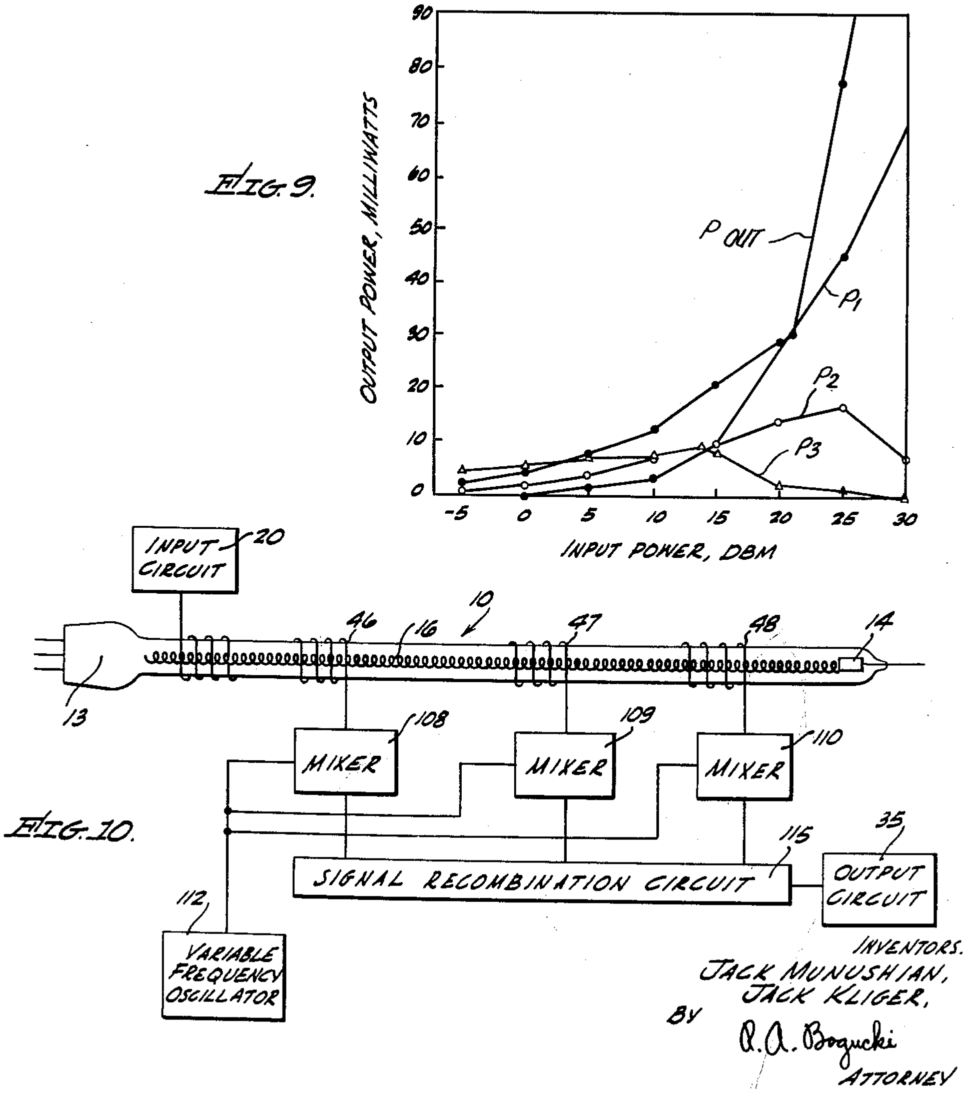
FIG. 9 is a graph of the output signal as a function of the input signal for the arrangement of FIG. 8.
FIG. 10 is a schematic and block diagram representation of another system in accordance with the invention, showing the manner in which RF to IF operation is provided.

The chart of output power in milliwatts versus input power, FIG. 9, shows the manner in which a logarithmic response may be provided with a desired synthesized characteristic from the arrangement of FIG. 8. It may again be seen that the signal from the first input coupler, designated by curve $P_1$ increases sharply with high input signals, because the arrangement is again such that a direct coupling exists between the input helix 23 and the first coupler 46 at these signal levels. The signals removed by the remaining two couplers 47 and 48, however, drop off after reaching peaks, as is shown by curves $P_2$ and $P_3$. The final synthesized response, shown by curve $P_{out}$, is a desired logarithmic response. FIG. 9 also shows some typical operating relationships for the traveling-wave tube.

The device in accordance with the invention may also be utilized to provide RF to IF conversion of signals. Such an arrangement is illustrated in FIG. 10, in which the arrangement of couplers 46 to 48 on a tube 10 are shown, for simplicity, as similar to the arrangement of FIG. 8. To provide IF operation, however, each of the couplers 46 to 48 is coupled to a different mixer 108 to 110 respectively. Each mixer 108 to 110 is also responsive to signals from a controllable variable frequency oscillator 112. Outputs from the mixers 108 to 110 are coupled to a signal recombination circuit 115, which term is intended to indicate generally one of the forms of additive circuits previously illustrated.

Therefore, the arrangement of FIG. 10 operates by mixing the RF signals removed by the various couplers 46 to 48 with the signals from the variable frequency oscillator 112. Each mixer 108 to 110 thus provides an IF output, and each of the IF outputs are additively combined in phase in the signal recombination circuit 115. Thus are IF signals synthesized to a desired response and made suitable for application to the output circuit 35.

Thus there has been described an improved microwave amplifier system and method by which selected dynamic responses can be obtained. In general, the use of this technique permits an appreciable increase in the dynamic range of existing devices. Whether utilized for logarithmic amplification or for signal limiting, or for some other particular response, there is available a signal compression which can markedly increase the versatility of a system. In addition to providing, for example, greatly increased dynamic range, such devices can be arranged to operate from microwave signals and to provide RF, IF or video output. In addition it should be noticed that the system of the invention does not affect the operating characteristics of the principal device. For example, with traveling-wave tubes, the desirable characteristics of low noise and broad bandwidth are retained as well as maximum amplification, if desired at the same time. Although thus providing functions which have heretofore been accomplished only with complex arrangements, systems in accordance with this invention are simple to construct and inherently stable and reliable.

We claim:

1. A microwave amplifier for providing, from an input microwave signal, an output microwave signal of corresponding frequency and selected signal relation, said system comprising: a traveling-wave tube amplifier having an extended helical slow-wave structure defining a central axis from an input end thereof, the helical slow-wave structure having selected axial phase velocity characteristics; a second helical slow-wave structure proximate, substantially parallel to and substantially coextensive with the helical slow-wave structure of the traveling-wave tube; an input circuit including an input helix wound concentrically about the input end of the helical slow-wave structure for providing thereto a signal to be amplified; a number of energy intercoupling means for the transfer of electromagnetic energy from the helical slow-wave structure to the second helical structure, each of said energy intercoupling means including a different helical coupler about the helical slow-wave structure of said traveling-wave tube for extracting energy from a region thereof and a helical coupler about a region of the added helical structure for providing energy thereto, the spacings between the adjacent intercoupling elements on the helical slow-wave structure and the corresponding elements on the additional helical structure being alike; and an output circuit including an electromagnetic energy wave coupler coupled to the additional helical structure in a region oppositely disposed from the input circuit with respect to the energy intercoupling means.

2. A microwave amplifier comprising: a traveling-wave tube having a gun end and a collector end and a helical slow-wave structure disposed along the electron stream therebetween, the electron gun end being the input end of the tube, the tube also including an envelope substantially pervious to microwave energy and contiguously encompassing the helix; a layer of resistive material disposed on the outer surface of the envelope for providing uniformity of the traveling wave and minimizing reflections in the tube; an adder helix disposed adjacent and substantially parallel the helix of the traveling-wave tube, the adder helix being at least partially coextensive with the helix of the traveling-wave tube and having like electrical characteristics as to the propagation of a traveling wave, the input and output ends of the adder helix corresponding to the like ends of the traveling-wave tube; a resistive termination coupled to the adder helix at the output end thereof; a source of input signals to be amplified; an input coupler of helical form encompassing the envelope of the traveling-wave tube at the input end of the helix therein and being concentric with the helix, the input coupler launching the traveling wave onto the traveling-wave tube helix; a group of microwave energy couplers, each consisting of a helical coupler encompassing a region of the traveling-wave tube envelope and a helical coupler coupled thereto encompassing a portion of the adder helix, each of the coupler helices on the traveling-wave tube providing extraction of electromagnetic wave energy from the traveling-wave tube helix and each of the coupled helices on the adder helix launching the energy onto the adder helix, the spacings between adjacent successive coupling helices on the traveling-wave tube and the corresponding coupling helices along the length of the adder helix being alike, each of the couplers thus providing extraction of the same input signals at selected time delays, the adder helix providing complementary time delays as to signals which are launched thereon so that the signal contributions from the energy couplers return to time coincidence at a selected total delay at the last coupler on the adder helix, a response characteristic for the system being selected by choice of the relative axial positions of the couplers and the coupling efficiency of the couplers, the couplers being arranged to compensate for nonlinearity after saturation in the couplers adjacent the output ends of the two helices; output means for synthesized signals including an output helix encompassing the output end of the adder helix for extracting therefrom the fully recombined signals; and output means for linear signals including a coupler at the output end of the traveling-wave tube helix.

3. A system for amplifying electromagnetic wave energy comprising in combination: electron gun means for launching a stream of electrons along a predetermined path of fixed length, a first slow-wave structure disposed along and about said path for propagating electromagnetic wave energy in such manner as to provide interaction between said electron stream and said electromagnetic wave energy, input coupling means disposed adjacent the end of said first slow-wave structure nearest said electron gun means for launching an electromagnetic wave onto said first slow-wave structure, whereby said electromagnetic wave travels along said first slow-wave structure, a second slow-wave structure having substantially the same electromagnetic wave propagating characteristics as said first slow-wave structure disposed substantially parallel to and coextensive with said first slow-wave structure, and a plurality of signal transfer means coupled to said first and second slow-wave structures at spaced regions along the lengths thereof for successively removing selected portions of the electromagnetic wave traveling along said first slow-wave structure and launching the removed portions of said wave onto said second slow-wave structure in time coincidence relative to said wave traveling along said first slow-wave structure.

References Cited in the file of this patent

UNITED STATES PATENTS

| | | |
|---|---|---|
| 2,726,291 | Quate | Dec. 6, 1955 |
| 2,733,305 | Diemer | Jan. 31, 1956 |
| 2,804,511 | Kompfner | Aug. 27, 1957 |
| 2,981,889 | Webber | Apr. 25, 1961 |
| 3,037,168 | Forrer | May 29, 1962 |

FOREIGN PATENTS

| | | |
|---|---|---|
| 706,094 | Great Britain | Mar. 24, 1954 |